(12) United States Patent
Pisek et al.

(10) Patent No.: US 7,668,992 B2
(45) Date of Patent: Feb. 23, 2010

(54) CONTEXT-BASED OPERATION RECONFIGURABLE INSTRUCTION SET PROCESSOR AND METHOD OF OPERATION

(75) Inventors: Eran Pisek, Plano, TX (US); Jasmin Oz, Plano, TX (US); Yan Wang, Plano, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 190 days.

(21) Appl. No.: 11/123,313

(22) Filed: May 6, 2005

(65) Prior Publication Data
US 2006/0184774 A1 Aug. 17, 2006

Related U.S. Application Data

(60) Provisional application No. 60/653,968, filed on Feb. 17, 2005.

(51) Int. Cl.
 *G06F 9/30* (2006.01)
 *G06F 7/00* (2006.01)
 *H04M 3/00* (2006.01)

(52) U.S. Cl. .................. 710/104; 712/227; 712/32; 712/37; 455/418; 713/310; 713/100

(58) Field of Classification Search .............. 717/155; 455/550.1, 552.1, 561; 713/1; 712/29, 248, 712/15, 227, 226
See application file for complete search history.

(56) References Cited

U.S. PATENT DOCUMENTS

| | | | | |
|---|---|---|---|---|
| 5,892,966 A | * | 4/1999 | Petrick et al. ................. 712/36 |
| 2004/0063425 A1 | * | 4/2004 | Wakutsu et al. ............. 455/418 |
| 2004/0139428 A1 | * | 7/2004 | Chuang et al. .............. 717/155 |
| 2004/0224647 A1 | * | 11/2004 | Ma et al. .................... 455/90.3 |
| 2004/0242261 A1 | * | 12/2004 | Fette ........................ 455/550.1 |
| 2005/0039185 A1 | * | 2/2005 | Heidari-Bateni et al. .... 718/104 |
| 2005/0097306 A1 | * | 5/2005 | Gajski ........................ 712/245 |
| 2005/0256969 A1 | * | 11/2005 | Yancey et al. ............... 709/238 |
| 2006/0211387 A1 | * | 9/2006 | Pisek et al. .................. 455/130 |
| 2007/0054662 A1 | * | 3/2007 | Dillinger et al. ............ 455/423 |

OTHER PUBLICATIONS

Wai-Kwong Lee et al., Finite State Machine Partitioning for Low Power, IEEE,1999.*
Kentaro Ikemoto et al., Adaptive Channel Coding Schemes Using Finite State Machine for Software Defined Radio, IEEE, 2002.*
Jorg Brakensiek et al., Software Radio Approach for Re-Configurable Miltu-Standard Radios, IEEE, 2002.*
Chow et al. Low Power Realization of Finite State Machines—A Decomposition Approach, ACM Transaction on Design Automation of Electronic Systems, vol. 1, No. 3, Jul. 1996, pp. 315-340.*

(Continued)

*Primary Examiner*—Henry W. H. Tsai
*Assistant Examiner*—Cheng-Yuan Tseng (57) ABSTRACT

A reconfigurable context-based operation instruction set processor for use in a processing system capable of executing a first instruction set. The reconfigurable context-based operation instruction set processor comprises: 1) a reconfigurable data path comprising a plurality of reconfigurable functional blocks; and 2) a programmable finite state machine capable of controlling the reconfigurable data path. The programmable finite state machine is capable of executing a first plurality of context-related instructions that are a first subset of the first instruction set.

35 Claims, 6 Drawing Sheets

OTHER PUBLICATIONS

Benini et al. Automatic Synthesis of Low-Power Gated-Clock Finite-State Machines, IEEE Transactions on Computer-Aided Design of Intergrated Circuits and Systems, vol. 15, No. 6, Jun. 1996, pp. 630-643.*

Monterio et al. Finite State Machine Decomposition for Low Power, DAC'98, 1998, pp. 758-763.*

P82B96 Dual bi-directional bus buffer, Mar. 2004, Philips, pp. 1-16.*

Wolf, Computer as Components: Principles of embedded computing system design, Morgan Kaufman, 2001, pp. 453-455.*

* cited by examiner

FIG. 1
(PRIOR ART)

| EVENT | START | S1 | S2 | S3 | S4 | S5 | S6 | S7 | S8 | S9 | S10 |
|---|---|---|---|---|---|---|---|---|---|---|---|
| E1 | S1 |  |  |  |  |  |  |  |  |  |  |
| E2 |  | S9 | S4 | S2 |  |  |  |  |  |  | S8 |
| E3 |  | S2 |  |  |  | S4 |  |  | S10 |  |  |
| E4 |  | S2 |  | S5 |  |  |  | S9 |  |  | S8 |
| E5 |  | S10 | S9 |  | S9 | S3 | S9 |  |  | S10 |  |
| E6 |  |  |  |  | S2 |  | S5 |  |  |  | S7 |
| E7 |  |  |  | S2 |  |  | S5 | S6 |  |  | STOP |

CONTEXT-BASED OPERATION RECONFIGURABLE INSTRUCTION SET PROCESSOR AND METHOD OF OPERATION

CROSS-REFERENCE TO RELATED APPLICATION AND CLAIM OF PRIORITY

The present invention is related to that disclosed in U.S. Provisional Patent No. 60/653,968, filed Feb. 17, 2005, entitled "Context-Based Operation Reconfigurable Instruction Set Processor". U.S. Provisional Patent No. 60/653,968 is assigned to the assignee of the present application. The subject matter disclosed in U.S. Provisional Patent No. 60/653,968 is hereby incorporated by reference into the present disclosure as if fully set forth herein. The present application hereby claims priority under 35 U.S.C. §119(e) to U.S. Provisional Patent No. 60/653,968.

TECHNICAL FIELD OF THE INVENTION

The present invention relates generally to data processors and, more specifically, to a data processor that uses reconfigurable instruction set hardware.

BACKGROUND OF THE INVENTION

Data processors are used in nearly every type of modern electronic device, including consumer electronics, industrial machinery, scientific apparatuses and communication networks. However, the performance and degree of complexity of the data processors (or microprocessors) used in different applications may vary widely. The speed and power requirements of a particular application are important in determining the type of data processor used.

The type of data processor used is particularly important in software-defined radio (SDR) implementations. An SDR device uses reconfigurable hardware that may be programmed over the air to operate under different wireless protocols. For example, an SDR transceiver in a wireless laptop computer may be configured by a first software load to operate in an IEEE-802.11x wireless network and may be reconfigured by a second software load to operate in a CDMA2000 wireless network.

There are six main types of data processors in common use: 1) digital signal processors, 2) reduced instruction set computers, 3) complex instruction set computers, 4) field programmable gate arrays, 5) application specific integrated circuits, and 6) application specific instruction set processors. Each of these types of data processors has particular advantages and particular disadvantages.

A digital signal processor (DSP) is a general-purpose processor optimized to efficiently execute digital signal processing operations, such as a Multiply-Accumulate operation for finite impulse response (FIR) filtering and Fast Fourier Transform (FFT) operations. A DSP implements many sophisticated addressing modes to cover many of the DSP calculation requirements, such as bit reverse addressing mode for FFT, index addressing for FIFO devices, and the like. Examples of DSPs include: 1) the MOTOROLA 56000, 56300, SC81xx, and MRC6011 processors; 2) the TEXAS INSTRUMENTS (TI) C55, C6203, C6416, and C67xx processors; 3) the ADI SHARC and TIGERSHARC processors; and 4) the MORPHO MS1-64 Reconfigurable DSP.

A reduced instruction set computer (RISC) is a general purpose processor (GPP) that mainly targets control applications, such as media access control (MAC) applications. The main advantage of the RISC machine is its simplicity. As its name, a RISC processor has small instruction set, which provides more code density as well as faster change-of-flow reaction. Examples of RISC devices include: 1) ARM processors (e.g., ARM926, ARM1136J); 2) MIPS processors (e.g., MIPS32, MIPS64); 3) the IBM POWERPC 405 and 750FX processor; and 4) the MOTOROLA POWERPC 603 processor.

A complex instruction set computer (CISC) device is a general purpose processor (GPP) targeted to the general purpose applications ranging from multimedia applications to PC applications. Examples of CISC processors include: 1) the INTEL PENTIUM processor; and 2) the MOTOROLA 68000 processor.

The field programmable gate array (FPGA) is a reconfigurable hardware device based on an array of hardware cells connected through long busses and local busses. FPGA devices are quite commonly used in wireless network base station applications and prototypes. Examples of FPGA devices include: 1) the XILINX VIRTEX IV device; and 2) the ALTERNA STRATIX II device.

An application specific integrated circuit (ASIC) is a hardware device specially designed for a specific application. An ASIC is usually very power efficient. ASIC devices are used in many wireless devices (i.e., cell phones, etc.). An application specific instruction set processor (ASIP) is an enhanced version of an ASIC device that adds more programmability to the ASIC hardware.

Each of the above-described processors has certain advantages and suffers from particular disadvantages. Digital signal processors are the most flexible type of processor, from a software point of view, in order to meet software-defined radio (SDR) requirements. However, DSP devices do not have enough MIPS performance and bit manipulation architecture to meet 3G and 4G bit-rate processing requirements. RISC processors target control applications, but are inadequate beyond baseband applications for wireless network implementations. CISC processors may have the flexibility and the MIPS performance to process baseband applications, but their poor power efficiency makes them unsuitable for handset power restrictions. FPGA devices, like CISC processors, may meet the required MIPS performance, but their poor power efficiency makes them unsuitable for handset designs.

ASIC devices are well matched to the power and cost restrictions of handset designs. However, their flexibility is too limited to make them suitable for SDR implementations. ASIP devices achieve greater flexibility than ASIC devices by adding more programmability to the application specific hardware and by introducing instruction-set processors to the hardware. However, since ASIPs are general-purpose devices, their processor core efficiency depends on the application being processed. The more control code in the application, the less efficient the ASIP will be. This results in poor performance and higher power consumption.

Additional disadvantages of the prior art processors are scalability and modularity. The software-defined radio (SDR) approach was created in order to minimize cost (design time, TTM) and power consumption and to maximize flexibility. The prior art processor implementations fail to provide an optimized combination of scalability and modularity.

Therefore, there is a need in the art for an improved data processor design for use in a wide variety of applications. In particular, there is a need for an improved data processor design for use in software-defined radio (SDR) wireless devices.

SUMMARY OF THE INVENTION

To address the above-discussed deficiencies of the prior art, it is a primary object of the present invention to provide a reconfigurable context-based operation instruction set processor for use in a processing system capable of executing a first instruction set. According to an advantageous embodiment of the present invention, the reconfigurable context-based operation instruction set processor comprises: 1) a reconfigurable data path comprising a plurality of reconfigurable functional blocks; and 2) a programmable finite state machine capable of controlling the reconfigurable data path. The programmable finite state machine is capable of executing a first plurality of context-related instructions that are a first subset of the first instruction set.

According to one embodiment of the present invention, the reconfigurable data path is configured by reconfiguration bits received from an external controller in the processing system.

According to another embodiment of the present invention, the programmable finite state machine is programmed by reconfiguration bits received from the external controller.

According to still another embodiment of the present invention, the reconfigurable context-based operation instruction set processor further comprises a program memory coupled to the programmable finite state machine, wherein the program memory is capable of storing the first plurality of context-related instructions for retrieval and execution by the programmable finite state machine.

According to yet another embodiment of the present invention, the first plurality of context-related instructions are stored in the program memory by the external controller.

According to a further embodiment of the present invention, the reconfigurable context-based operation instruction set processor may be disabled by the external controller during a time period in which a second reconfigurable context-based operation instruction set processor associated with the processing system is operating.

According to a still further embodiment of the present invention, the second reconfigurable context-based operation instruction set processor is capable of executing a second plurality of context-related instructions that are a second subset of the first instruction set.

According to a yet further embodiment of the present invention, the processing system comprises a software-defined radio device.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 6, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged processing system.

Figure 1:
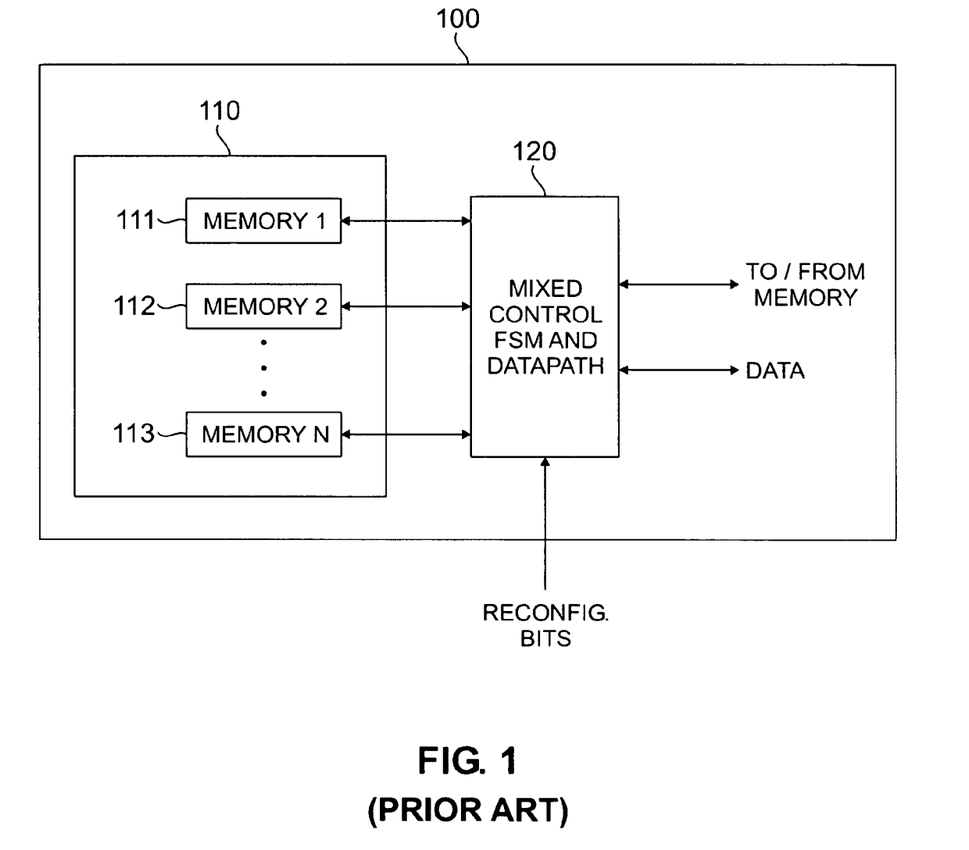
FIG. 1 is a block diagram of a conventional data processor according to an exemplary embodiment of the prior art.

FIG. 1 is a high-level block diagram of conventional data processor 100 according to an exemplary embodiment of the prior art. FIG. 1 depicts a general implementation of an application in hardware and software. Data processor 100 comprises memory 110 and control circuitry 120. Control circuitry 120 further comprises mixed control finite state machine (FSM) circuitry and datapath circuitry. Memory 110 further comprises N memory blocks, including exemplary memory blocks 111-113, which are arbitrarily labeled Memory 1, Memory 2, and Memory N.

Any data processor application may be regarded as a set of datapaths controlled and scheduled by a finite state machine (FSM), as FIG. 1 shows. A finite state machine receives input events and, in response, transitions between states and/or generates outputs. The FSM decides to which states to transition based on the current state and the received input events.

Figure 2:
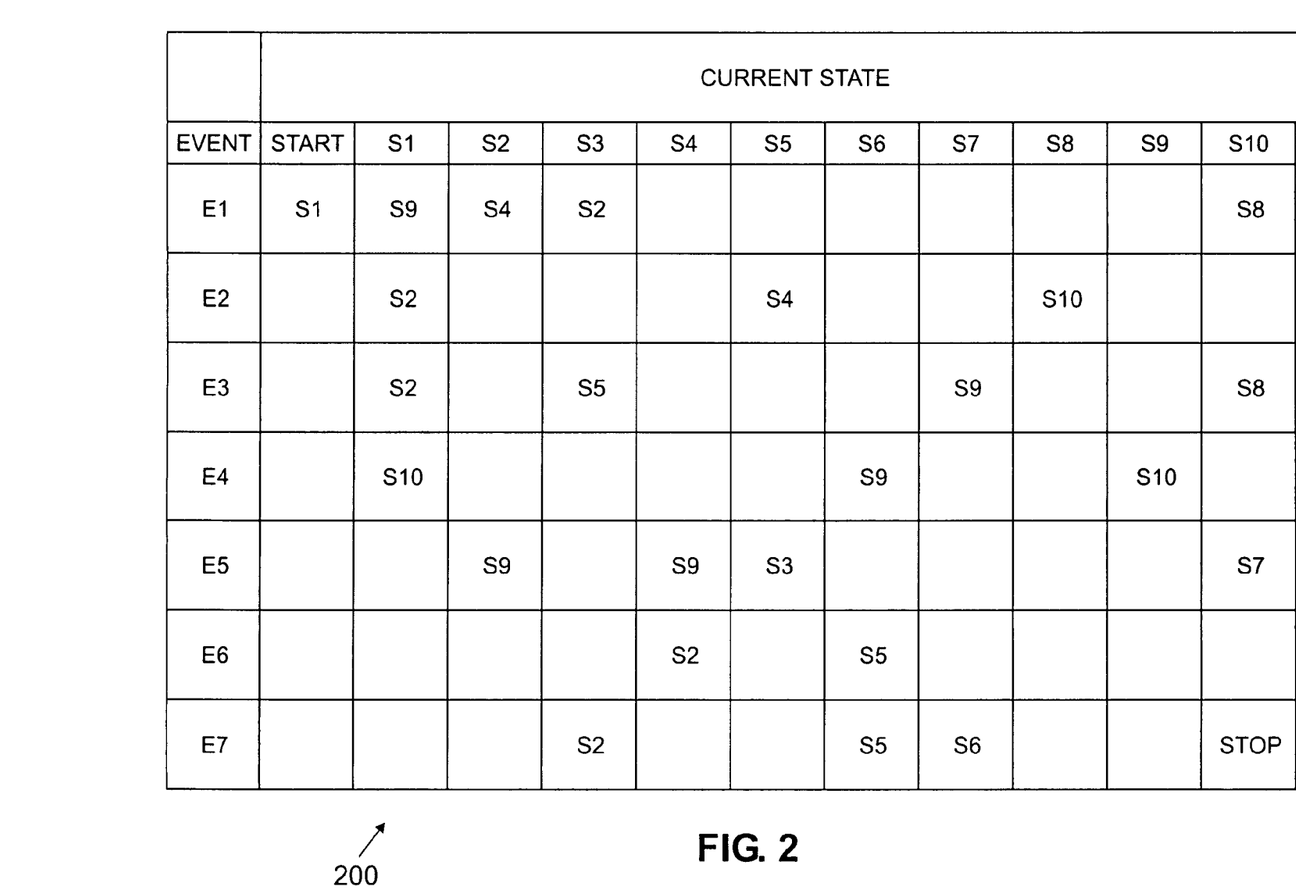
FIG. 2 illustrates a finite state machine (FSM) table for a data processor.

FIG. 2 illustrates finite state machine (FSM) table 200 for an exemplary data processor. FSM table 200 depicts the next state transitions performed by a FSM based on the current state (i.e., one of states S1-S10) and the received input event (i.e., one of events E1-E7). Initially, the FSM is in state S1. The column for state S1 indicates the state transitions for state S1 in response to events E1-E4.

In response to event E1 received during state S1, the FSM transitions from state S1 to state S9. In response to event E2 received during state S1, the FSM transitions from state S1 to state S2. In response to event E3 received during state S1, the FSM transitions from state S1 to state S2. In response to event E4 received during state S1, the FSM transitions from state S1 to state S10.

As FIG. 2 makes clear, there are many holes in the FSM table 200 for which no values are given. For example, for state S1, no values are given for events E5-E7. In prior art data processors, those holes, although they do not contribute to the flow of the finite state machine, must be provided for, otherwise the finite state machine will not work correctly. In the prior art data processors, the finite state machines cannot be further optimized to eliminate these holes.

Figure 3:
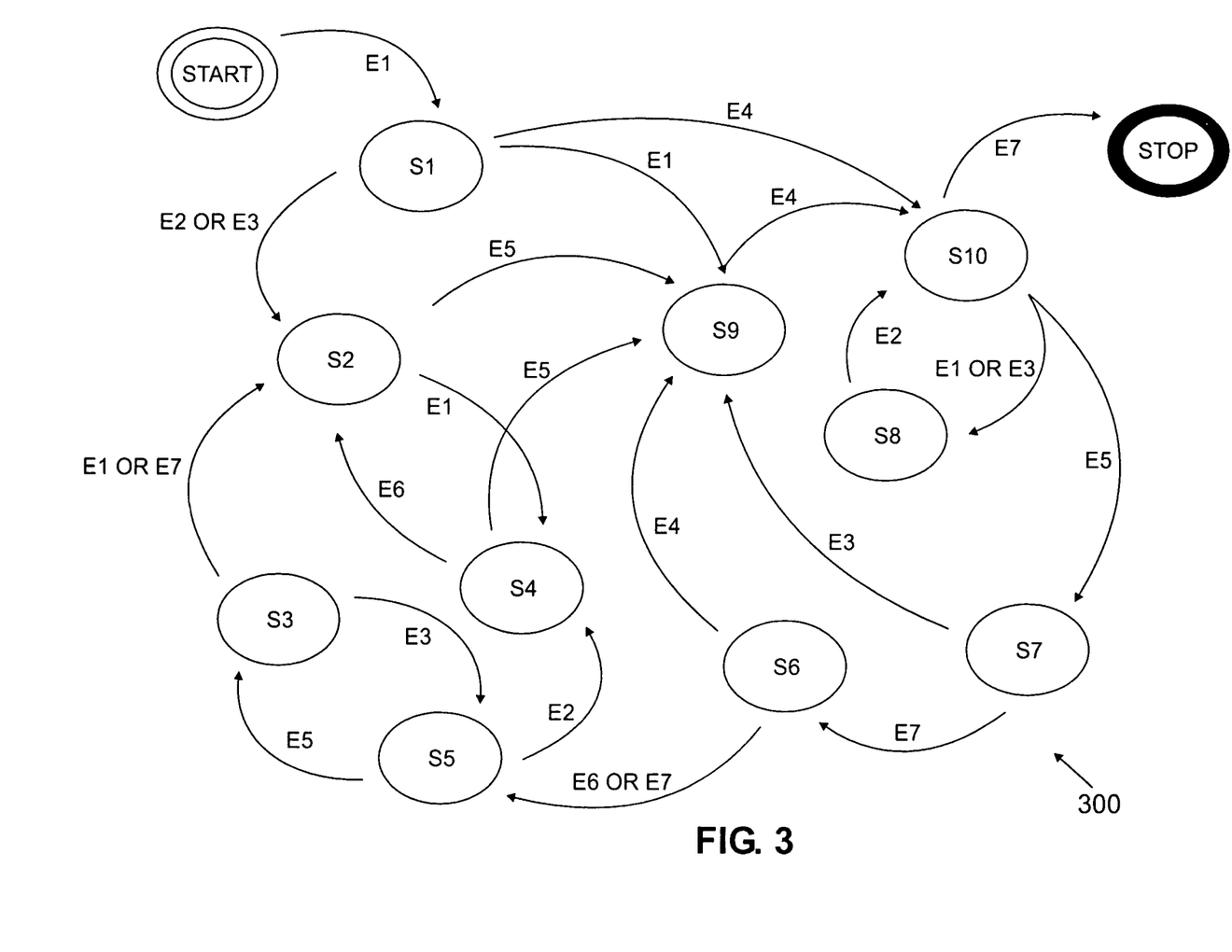
FIG. 3 is a bubble diagram corresponding to the finite state machine table in FIG. 2.

FIG. 3 illustrates bubble diagram 300, which corresponds to the finite state machine table in FIG. 2. Each of states S1-S10 is represented by a bubble and events E1-E7 cause transitions between states. These transitions are represented by the arrowed lines connecting the state bubbles. The arrowhead determines the direction of the transition.

Figure 4:
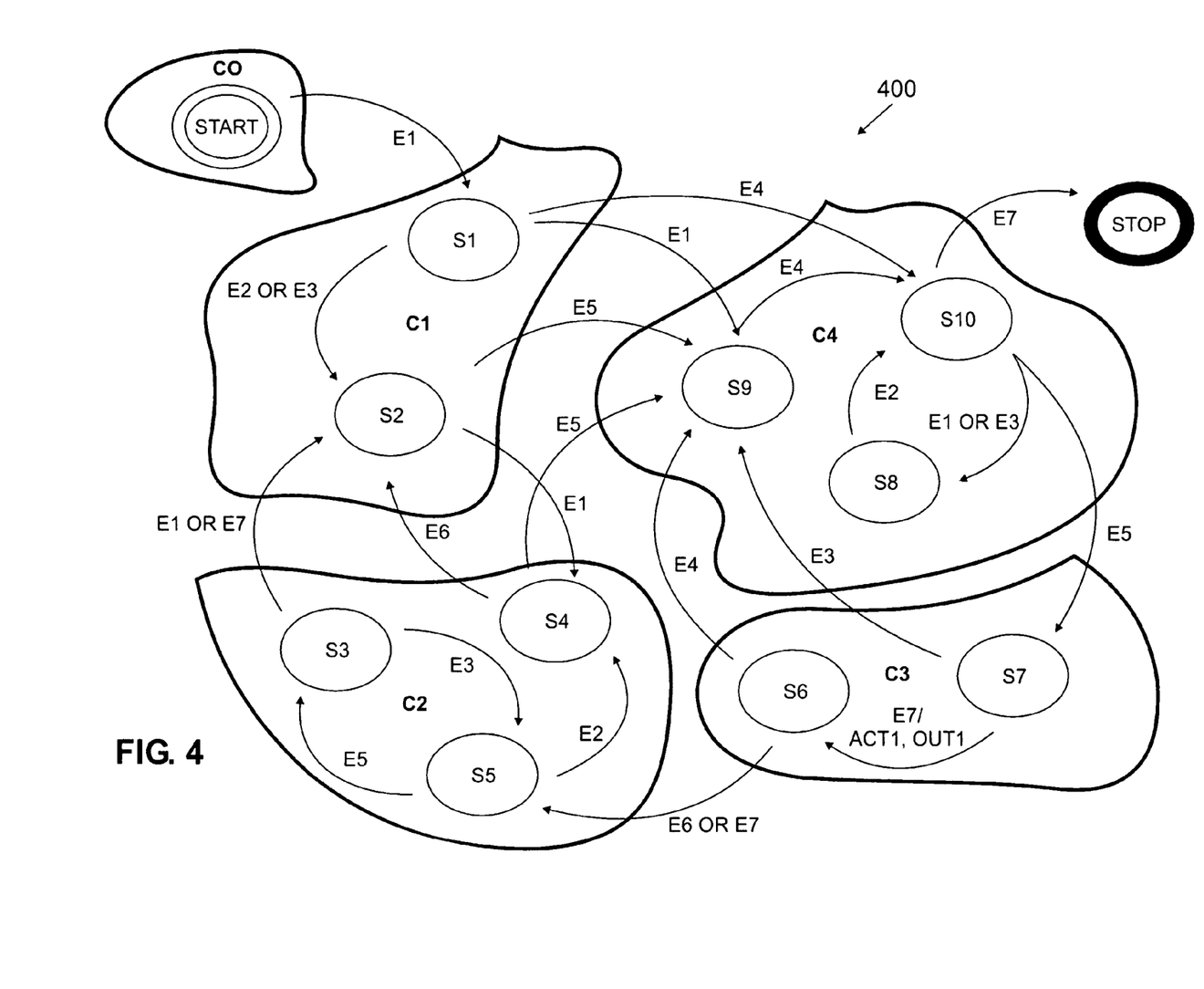
FIG. 4 is a bubble diagram showing context-based groupings of states in the finite state machine table in FIG. 2 according to an exemplary embodiment of the present invention.

It is noted that in bubble diagram 300, it is possible to groups states according to contexts of execution units. FIG. 4 illustrates bubble diagram 400, in which states of the finite state machine table in FIG. 2 that are related to the same context are grouped together according to the principles of the present invention. The groupings of states form contexts C0, C1, C2, C3 and C4.

Each of the groupings of states in FIG. 4 may be used to create a context-based operation reconfigurable instruction set processor (CRISP) according to the principles of the present invention. Each of contexts C0-C4 comprises a minimum number of input events and a set of probable operations. Each context also has its own data path, which may comprise parallel execution units while the instruction set execution may be either in a VLIW, SIMD, microcode or other known implementation manner to increase the overall performance.

Figure 5:
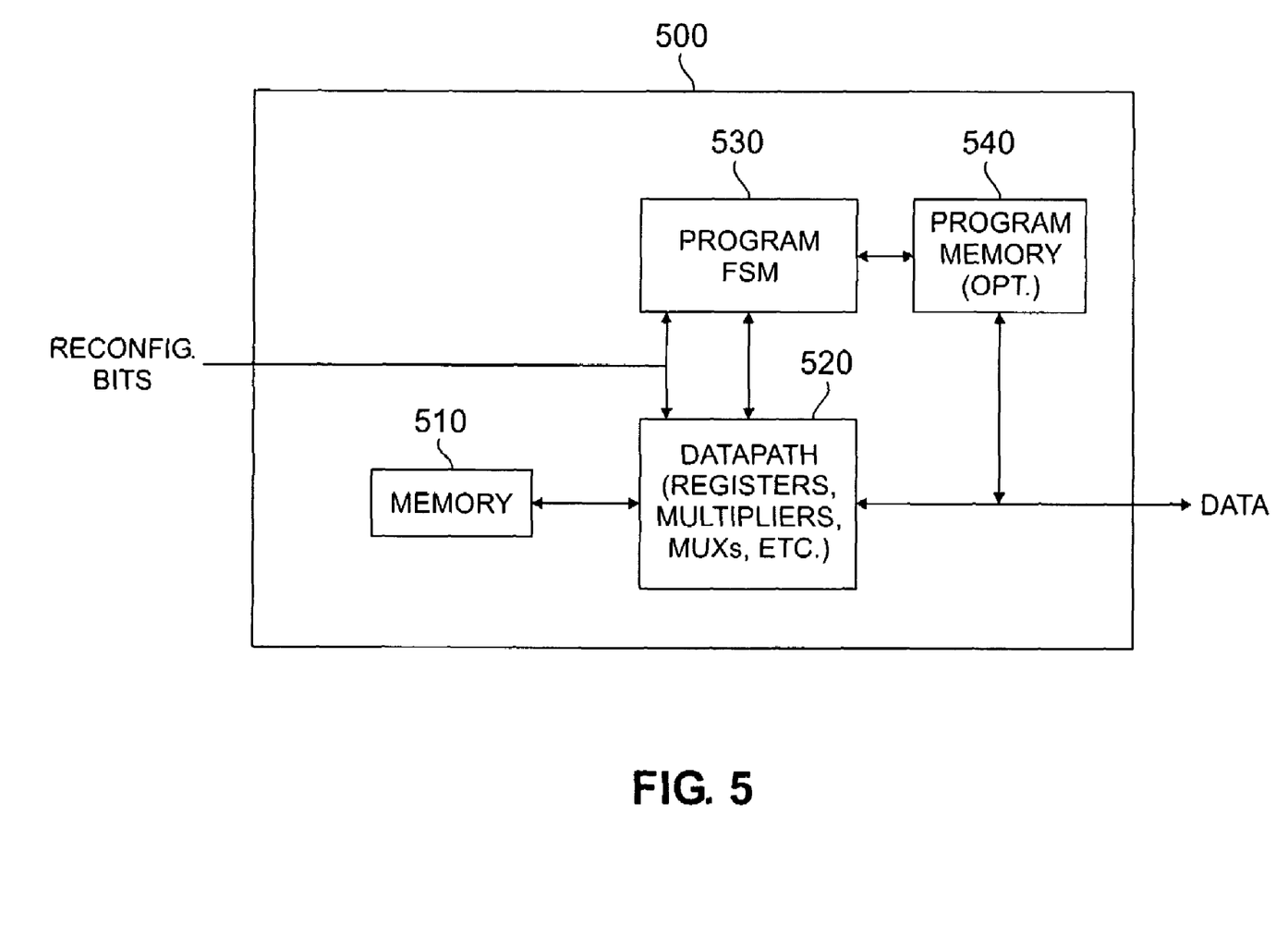
FIG. 5 is a high-level block diagram of a context-based operation reconfigurable instruction set processor according to an exemplary embodiment of the present invention.

FIG. 5 is a high-level block diagram of context-based operation reconfigurable instruction set processor (CRISP) 500, according to an exemplary embodiment of the present invention. CRISP 500 comprises memory 510, programmable data path circuitry 520, programmable finite state machine 530, and optional program memory 540. CRISP 500 is designed to implement only a subset of context-related instructions from FIG. 4 in an optimum manner. Each of the contexts C0-C4 in FIG. 4 may be implemented by a separate CRISP similar to CRISP 500. Context-based operation reconfigurable instruction set processor (CRISP) 500 defines the generic hardware block that usually consists of higher level hardware processor blocks. The principle advantage to CRISP 500 is that CRISP 500 breaks down the required application into two main domains, a control domain and a data path domain, and optimize each domain separately. By implementing a data processor application, such as a mobile station handset (e.g., cell phone, wireless laptop), using CRISP 500, the present invention at least partially overcomes the flexibility vs. power problems that adversely affect conventional data processor applications.

The control domain is implemented by programmable finite state machine 530, which may comprise a DSP, an MCU or another prior art device. Programmable FSM 530 is configured by reconfiguration bits received from an external controller (not shown). Programmable FSM 530 may execute a program stored in associated optional program memory 540. The program may be stored in program memory 540 via the DATA line from an external controller (not shown). Memory 510 is used to store application data used by data path circuitry 520.

Programmable data path circuitry 520 is divided into a set of building blocks that perform particular functions (e.g., registers, multiplexers, multipliers, and the like). Each of building blocks is both reconfigurable and programmable to allow maximum flexibility. The criteria for dividing programmable data path circuitry 520 into functional blocks depends on the level of reconfigurability and programmability required for a particular application.

Since each of the contexts C0-C4 in FIG. 4 is implemented by a separate CRISP 500 that works independently of other CRISPs, the present invention provides an efficient power management scheme that is able to shut down a CRISP when the CRISP is not required to execute. This assures that only the CRISPs that are needed at a given time are active, while other idle CRISPs do not consume any significant power.

A CRISP according to the principles of the present invention may be targeted to many applications, such as, but not limited to, baseband applications in wireless devices and multimedia applications. In many applications, these contexts may be loosely-coupled independent contexts that may run concurrently with either minimum or no dependencies.

Figure 6:
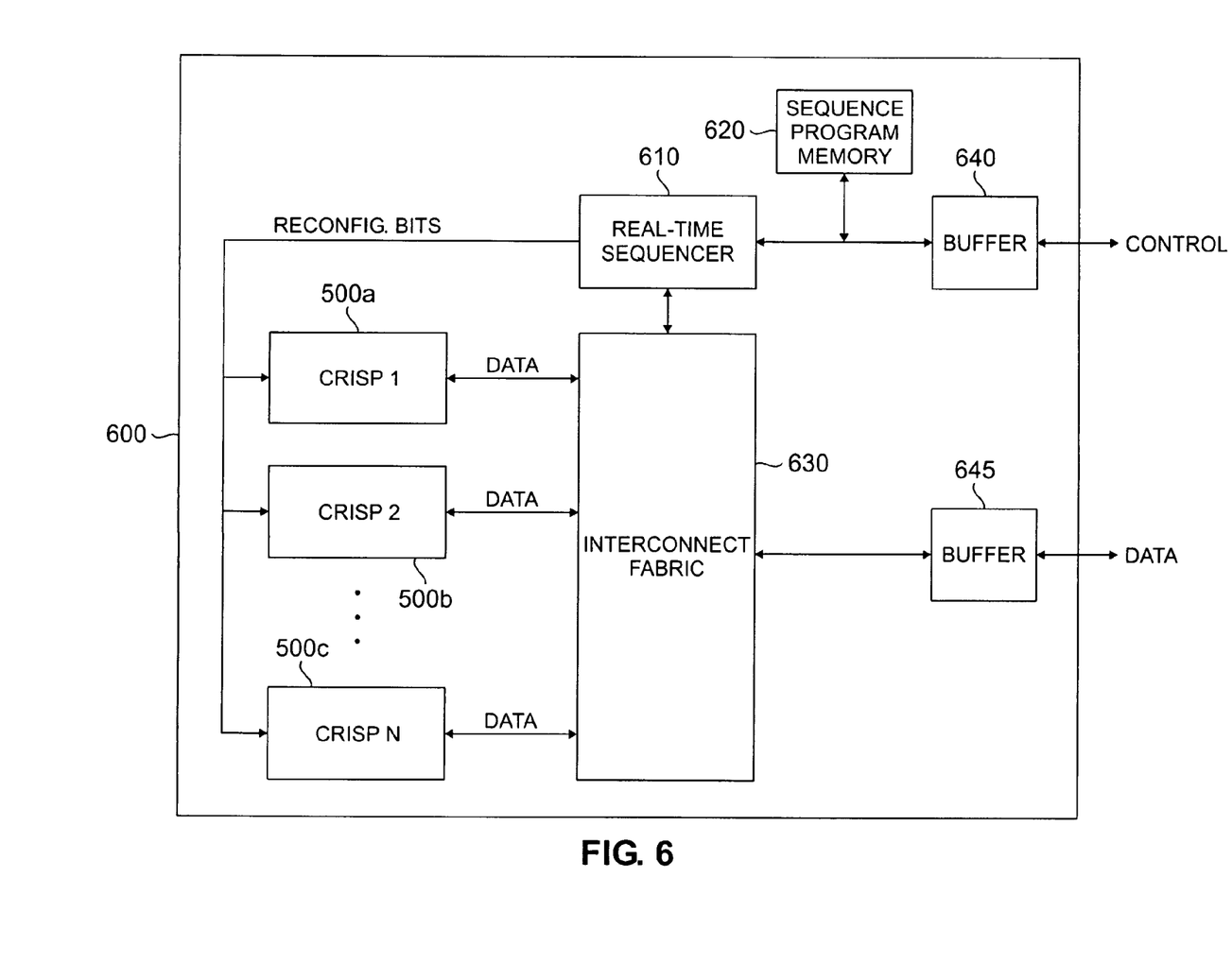
FIG. 6 is a high-level block diagram of a reconfigurable processing system comprising a plurality of context-based operation reconfigurable instruction set processors according to an exemplary embodiment of the present invention.

FIG. 6 is a high-level block diagram of reconfigurable processing system 600 according to an exemplary embodiment of the present invention. Reconfigurable processing system 600 comprises N context-based operation reconfigurable instruction set processors (CRISPs), including exemplary CRISPs 500a, 500b, and 500c, which are arbitrarily labeled CRISP 1, CRISP 2 and CRISP N. Reconfigurable processing system 600 further comprises real-time sequencer 610, sequence program memory 620, programmable interconnect fabric 630, and buffers 640 and 645.

Reconfiguration bits may be loaded into CRISPs 500a, 500b, and 500c from the CONTROL line via real-time sequencer 610 and buffer 640. A control program may also be loaded into sequence program memory 620 from the CONTROL line via buffer 640. Real-time sequencer sequences the contexts to be executed by each one of CRISPs 500a-c by retrieving program instructions from program memory 620 and sending reconfiguration bits to CRISPs 500a-c. In an exemplary embodiment, real-time sequencer 610 may comprise a stack processor, which is suitable to operate as a real-time scheduler due to its low latency and simplicity.

Reconfigurable interconnect fabric 630 provides connectively between each one of CRISPs 500a-c and an external DATA bus via bi-directional buffer 645. In an exemplary embodiment of the present invention, each one of CRISPs 500a-c may act as a master of reconfigurable interconnect fabric 630 and may initiate address access. The bus arbiter for reconfigurable interconnect fabric 630 may be internal to real-time sequencer 610.

In an exemplary embodiment, reconfigurable processing system 600 may be, for example, a cell phone or a similar wireless device, or a data processor for use in a laptop computer. In a wireless device embodiment implemented according to a software-defined radio (SDR) principles, each one of CRISPs 500a-c is responsible for executing a subset of context-related instructions that are associated with a particular reconfigurable function. For example, CRISP 500a may be configured to execute context-related instructions that process CDMA baseband signals or OFDMA baseband signals. CRISP 500b may be configured to execute context-related instructions that act as a memory controller. CRISP 500c may be configured to execute context-related instructions that perform MPEG-4 processing for multimedia applications.

A CRISP according to the principles of the present invention provides a new way of implementing reconfigurable hardware acceleration techniques. The present invention provides reconfigurability and programmability with minimum sacrifice on power efficiency. Since the CRISPs are largely independent and may be run simultaneously, the present invention has the performance advantage of parallelism without incurring the full power penalty associated with running parallel operations. The loose coupling and independence of CRISPs allows them to be configured for different systems and functions that may be shut down separately.

Although the present invention has been described with an exemplary embodiment, various changes and modifications may be suggested to one skilled in the art. It is intended that the present invention encompass such changes and modifications as fall within the scope of the appended claims.

What is claimed is:

1. For use in a software-defined radio processing system executing an instruction set, a reconfigurable context-based operation instruction set processor comprising:
   an application splitter that splits an instruction set into a control domain and a data path domain;
   a reconfigurable control domain, wherein the reconfigurable control domain executes at least one program using the data path domain;
   a reconfigurable data path configured by reconfigurable bits received from an external controller comprising a plurality of reconfigurable functional blocks to carry out instructions of data path domain;
   a programmable finite state machine configured by reconfigurable bit received from the external controller,
   wherein each state of said programmable finite state machine is associated with a first context controlling said reconfigurable data path,
   wherein said instruction set comprises a plurality of subsets, each subset associated with a specific context,
   wherein at least one subset includes a plurality of instructions,
   wherein said programmable finite state machine executing a first one of said plurality of subsets, said first subset associated with said first context; and
   a power management controller deactivating a part of said reconfigurable context-based operation instruction set processor by 1) said external controller when the control domain is inactive or 2) a time period a second reconfigurable context-based operation instruction set processor of executing a second context of said plurality of subsets when a second control domain is active.

2. A reconfigurable software-defined radio data processor configured by reconfiguration bits received from an external controller executing an instruction set, said reconfigurable data processor comprising:
   a first reconfigurable context-based operation instruction set processor comprising:
   a first reconfigurable data path comprising a first plurality of reconfigurable functional blocks; and
   a first programmable finite state machine controlling said first reconfigurable data path,
   wherein said instruction set comprises a plurality of subsets, each subset associated with a specified context, and said first programmable finite state machine executing a first one of said plurality of subsets,
   wherein each state of said programmable finite state machine is associated with a first context,
   wherein at least one subset includes a plurality of instructions,
   wherein said first subset is associated with said first context;
   a second reconfigurable context-based operation instruction set processor comprising:
   a second reconfigurable data path comprising a second plurality of reconfigurable functional blocks; and
   a second programmable finite state machine of controlling said second reconfigurable data path, and executing a second one of said plurality of subsets associated with a second context; and
   a power management controller deactivating the reconfigurable context-based operation instruction set processor when the control domain is not active, wherein said first reconfigurable context-based operation instruction set processor disabled by said external controller when said second reconfigurable context-based operation instruction set processor is operating, and said second reconfigurable context-based operation instruction set processor disabled by said external controller when said first reconfigurable context-based operation instruction set processor is operating.

3. For use in a software-defined radio processing system, a method of executing an instruction set in a reconfigurable context-based operation instruction set processor, said method comprising:
   controlling a reconfigurable data path having a plurality of reconfigurable functional blocks using a programmable finite state machine, wherein each state of said programmable finite state machine is associated with a first context and a first power requirement, and
   executing a first subset of said instruction set using the programmable finite state machine,
   wherein said first subset is associated with said first context,
   wherein said instruction set comprises a plurality of subsets, each subset associated with a specified context,
   wherein at least one subset includes a plurality of instructions, and
   wherein said first subset is a first one of said plurality of subsets; and
   disabling at least a part of said reconfigurable context-based operation instruction set using said external controller during at least one of: an inactive time period and a time period in which a second reconfigurable context-based operation instruction set processor associated with said processing system is operating, and executing a second subset of said instruction set using said second reconfigurable context-based operation instruction set processor, said second subset associated with a second context, wherein said second subset is a second one of said plurality of subsets.

4. A software-defined radio processing system executing an instruction set, the instruction set comprising a plurality of subsets, the processing system comprising:
   a first context-based operation reconfigurable instruction set processor CRISP comprising a first programmable finite state machine having states associated with a first context and controlling the first reconfigurable data path, wherein said CRISP executing a first one of said plurality of subset, the first subset associated with the first context and the first subset including a plurality of instructions;
   a second CRISP independent from the first CRISP comprising a second programmable finite state machine having states associated with a second context, wherein the second CRISP executing a second subset of the instruction set, the second subset associated with the second context; and
   a power management unit designed to alternatively active or deactive the first and second CRISP based upon current power and performance requirements of the instruction set, wherein the first and second CRISP execute instructions in parallel, wherein a part of the first CRISP disabled by an external controller in the processing system at a time period of the first CRISP inactive or at a time period of the second CRISP is operating, and a part of the second CRISP disabled by the external controller during an inactive time period of the second CRISP or a time period the first CRISP is operating.

5. A method for implementing a software-defined radio processing system configurable using reconfiguration bits received from an external controller executing an instruction set, the instruction set comprising a plurality of subsets, the method comprising:

generating a plurality of contexts based on a plurality of states, each context comprising associated states;

for each context, providing a corresponding independent context-based operation reconfigurable instruction set processor CRISP comprising an independently reconfigurable data path controlled by an independently programmable finite state machine;

for each CRISP, executing one of the plurality of subsets, the subset related to the context corresponding to the CRISP, wherein at least one subset includes a plurality of instructions; and a power management unit designed to alternatively activate or deactivate each CRISP based upon current power and performance requirements of the instruction set, wherein each CRISP executes instructions in parallel, and disabling at least a part of a first CRISP using the external controller in the processing system during at least one of an inactive time period for the first CRISP and a time period in which a second CRISP is executing the subset related to the context corresponding to the second CRISP.

6. The processing system as set forth in claim 4, further comprising a real-time sequencer coupled to the first CRISP and to the second CRISP, the real-time sequencer operable to reconfigure the first CRISP and the second CRISP and to provide bus arbitration for access to a reconfigurable interconnect fabric by the first CRISP and the second CRISP.

7. The reconfigurable context-based operation instruction set processor as set forth in claim 1, wherein said first subset is related to code division multiple access CDMA baseband processing.

8. The reconfigurable context-based operation instruction set processor as set forth in claim 1, wherein said first subset is related to orthogonal frequency division multiple access OFDMA based processing.

9. The reconfigurable data processor as set forth in claim 2, wherein said first reconfigurable data path and said first programmable finite state machine are configured by reconfiguration bits received from the external controller in said software-defined radio system.

10. The reconfigurable data processor as set forth in claim 9, wherein said second reconfigurable data path and said second programmable finite state machine are configured by reconfiguration bits received from said external controller.

11. The reconfigurable data processor as set forth in claim 10, further comprising a program memory coupled to said second programmable finite state machine, wherein said program memory is capable of storing said second subset for retrieval and execution by said second programmable finite state machine.

12. The reconfigurable data processor as set forth in claim 11, wherein said second subset is stored in said program memory by said external controller.

13. The method of claim 3, further comprising configuring said reconfigurable data path using reconfiguration bits received from an external controller in said processing system.

14. The method of claim 13, further comprising configuring said programmable finite state machine using reconfiguration bits received from said external controller.

15. The method of claim 3, wherein said processing system comprises a software-defined radio device.

16. The method of claim 15, wherein said first subset is related to code division multiple access (CDMA) baseband processing.

17. The method of claim 15, wherein said first subset is related to orthogonal frequency division multiple access (OFDMA) baseband processing.

18. The processing system as set forth in claim 4, wherein the first reconfigurable data path is configured by reconfiguration bits received from an external controller in the processing system, and the second reconfigurable data path is configured by reconfiguration bits received from the external controller.

19. The processing system as set forth in claim 18, wherein the first programmable finite state machine is configured by reconfiguration bits received from the external controller, and the second programmable finite state machine is configured by reconfiguration bits received from the external controller.

20. The processing system as set forth in claim 4, the first CRISP further comprising a first program memory coupled to the first programmable finite state machine, wherein the first program memory is storing the first subset for retrieval and execution by the first programmable finite state machine, and the second CRISP further comprising a second program memory coupled to the second programmable finite state machine, wherein the second program memory is storing the second subset for retrieval and execution by the second programmable finite state machine.

21. The processing system as set forth in claim 20, wherein the first subset is stored in the first program memory by an external controller in the processing system, and wherein the second subset is stored in the second program memory by the external controller.

22. The processing system as set forth in claim 4, wherein the first subset is related to code division multiple access (CDMA) baseband processing.

23. The processing system as set forth in claim 4, wherein the first subset is related to orthogonal frequency division multiple access (OFDMA) baseband processing.

24. The processing system as set forth in claim 4, the real-time sequencer comprising a stack processor.

25. The processing system as set forth in claim 6, further comprising the reconfigurable interconnect fabric coupled to the first and second CRISPs and to the real-time sequencer, the reconfigurable interconnect fabric operable to provide connectivity between the first and second CRISPs and an external data bus.

26. The processing system as set forth in claim 25, further comprising a bi-directional buffer, the reconfigurable interconnect fabric operable to provide connectivity between the first and second CRISPs and the external data bus via the bi-directional buffer.

27. The processing system as set forth in claim 6, further comprising a sequence program memory coupled to the real-time sequencer, the sequence program memory operable to store a control program for the processing system.

28. The method as set forth in claim 5, further comprising, for each CRISP, configuring the reconfigurable data path using reconfiguration bits received from an external controller in the processing system.

29. The method as set forth in claim 28, further comprising, for each CRISP, configuring the programmable finite state machine using reconfiguration bits received from the external controller.

30. The method as set forth in claim 5, wherein each CRISP further comprises a program memory coupled to the programmable finite state machine, the method further comprising storing the subset in the program memory for retrieval and execution by the programmable finite state machine.

31. The method as set forth in claim 30, further comprising, for each CRISP, storing the subset in the program memory using an external controller in the processing system.

32. The method as set forth in claim 5, wherein a first subset is related to code division multiple access (CDMA) baseband processing.

33. The method as set forth in claim 5, wherein a first subset is related to orthogonal frequency division multiple access (OFDMA) baseband processing.

34. The method as set forth in claim 5, further comprising providing bus arbitration for access to a reconfigurable interconnect fabric by each of the CRISPs.

35. The method as set forth in claim 5, further comprising sequencing the subsets to be executed by each of the CRISPs by retrieving program instructions from a program memory and sending reconfiguration bits to the CRISPs.

* * * * *